United States Patent
Cockburn et al.

(10) Patent No.: US 6,693,567 B2
(45) Date of Patent: Feb. 17, 2004

(54) MULTI-BYTE LEMPEL-ZIV 1(LZ1) DECOMPRESSION

(75) Inventors: Gordon J. Cockburn, Southampton (GB); Adrian John Hawes, Eastleigh (GB)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/447,432

(22) Filed: May 28, 2003

(65) Prior Publication Data

US 2003/0231122 A1 Dec. 18, 2003

(30) Foreign Application Priority Data

Jun. 14, 2002 (GB) .............................................. 0213687

(51) Int. Cl.[7] ................................................. H03M 7/34
(52) U.S. Cl. .......................................... 341/51; 341/50
(58) Field of Search ............................... 341/51, 50, 67

(56) References Cited

U.S. PATENT DOCUMENTS 5,640,158 A * 6/1997 Okayama et al. ............. 341/51
5,771,011 A * 6/1998 Masenas ....................... 341/51
5,929,791 A * 7/1999 Masenas ....................... 341/51

* cited by examiner

*Primary Examiner*—Brian Young
*Assistant Examiner*—Joseph Lauture
(74) *Attorney, Agent, or Firm*—Randall J. Bluestone; Harrington & Smith, LLP

(57) ABSTRACT

A method and arrangement are described for decompressing three or more bytes per processor cycle from a stream of compressed data using a processing pipeline, in which the compressed data is represented by tokens of varying and unknown length by accepting as input the stream of token data, partially decoding a token from the token data to determine a boundary position of the token; and priming the processing pipeline with the token and a length marker indicating the boundary position. Literal data is detected and output directly, copy pointers are checked to find their targets and resolved either from the history buffer or from the in-process contents of the pipeline.

24 Claims, 3 Drawing Sheets

MULTI-BYTE LEMPEL-ZIV 1(LZ1) DECOMPRESSION

FIELD OF THE INVENTION

This invention relates to data decompression, and particularly to 'LZ1' data decompression.

BACKGROUND OF THE INVENTION

The Lempel-Ziv algorithms are well known in the field of data compression. In particular, the "history buffer" version, known as LZ1, has become particularly popular in hardware implementations wherever lossless compression of coded data is required, since its relatively modest buffer requirements and predictable performance make it a good fit for most technologies.

The LZ1 algorithm works by examining the input string of characters and keeping a record of the characters it has seen. Then, when a string appears that has occurred before in recent history, it is replaced in the output string by a "token": a code indicating where in the past the string has occurred and for how long. Both the compressor and decompressor must use a "history buffer" of a defined length, but otherwise no more information need be passed between them.

Characters that have not been seen before in a worthwhile string are coded during compression as a "literal". This amounts to an expansion of the number of bits required, but in most types of data the opportunities for token substitution (and hence compression) outweigh the incompressible data, so overall compression is achieved. Typical compression ratios range from 2:1 to around 10:1.

Some variations of the basic LZ1 algorithm have emerged over the years, but improvements have been incremental.

As the LZ1 algorithm works on units of a byte, traditional hardware implementations consider just one byte at a time when decompressing the input stream.

LZ1 compressed data consists of a stream of variable length tokens, each of which must be decoded in turn, to produce the decompressed data. A token in the compressed data stream may either be a literal which contains one byte of data, or else a copy pointer which specifies a string of bytes, which can be obtained by reference to the most recent bytes which have already been decompressed and are held for this purpose in the history buffer.

With traditional one byte hardware decompression, only one input token needs to be considered in each cycle. A literal is fully decoded in one cycle, while a copy pointer takes several cycles to decode. Exactly one byte of decompressed data is produced each cycle.

To increase the performance of hardware decompression there are two alternatives: to reduce the cycle time or to produce more decompressed bytes per cycle. Although the easier of the two options, work to reduce the cycle time typically only yields a small improvement in performance. Any attempted multi-byte approach will lead to a significantly more complex design, but has the advantage that it is able to provide a performance which is many times that of the single byte case. The only previous attempted multi-byte hardware LZ1 implementation, that of U.S. Pat. No. 5,771,011 and its divisional U.S. Pat. No. 5,929,791, was inherently limited to two bytes per cycle.

The problems associated with multi-byte hardware decompression arise from the following characteristics of the compressed input data stream:

1. An input token produces a variable number of bytes from 1 to 271.
2. The input tokens are variable length (9,12,14,16,18 or 22 bits).

It is desirable to make multibyte decompression possible by pipelining the operation into several stages. However because of the nature of the data the following problems arise:

1. In order to produce, for example, 12 bytes of output, it is not easily known how many input tokens are required. For example the 12 bytes could come from 12 literal tokens, or from part of one long token containing more than 12 bytes. Without knowing how many tokens have been processed in one cycle it is not possible to start the next cycle.
2. Because the tokens are variable length, it is impossible to extract the next 12 tokens from the input data in one cycle. On first inspection it appears necessary to do this in order to know how much data has been used from the input stream so that the next cycle can process the input stream at the correct position.
3. When decoding a group of 12 bytes, one of the later bytes may be produced from a copy pointer token which points to one or more of the earlier bytes, whose value may not yet be known if it is in the process of being decoded from a copy pointer token.

In order to increase the performance of hardware decompression of LZ1 compressed data, it is desirable to process multiple bytes per cycle, while overcoming the above problems.

SUMMARY OF THE INVENTION

The present invention accordingly provides, in a first aspect, a method for decompressing three or more bytes per processor cycle from a stream of compressed data using a processing pipeline, wherein said compressed data is represented by tokens of varying and unknown length, the method comprising the steps of: accepting as input said stream, comprising token data; partially decoding a token from said token data to determine a boundary position of said token; and priming said processing pipeline with said token and a length marker indicating said boundary position.

The method of the first aspect preferably further comprises the steps of: determining if any token in said processing pipeline represents literal data and if any token in said processing pipeline represents a copy pointer; responsive to said step of determining, marking each token with a marker, said marker indicating which of literal data and copy pointer is represented; and passing literal data from any of said tokens marked as representing literal data directly to an output means.

The method of the first aspect preferably further comprises the steps of: determining if any of said tokens marked as representing a copy pointer has a copy pointer pointing into said tokens in said processing pipeline at a pointed-to token; and responsive to a determination that a copy pointer is pointing into said tokens in said processing pipeline at a pointed-to token, replacing said copy pointer with the pointed-to token.

The method of the first aspect preferably further comprises the steps of: replacing said pointed-to token with its pointed-to data; and passing said pointed-to data to an output means.

In a second aspect, the present invention provides an arrangement for decompressing three or more bytes per processor cycle from a stream of compressed data using a processing pipeline, wherein said compressed data is represented by tokens of varying and unknown length, the arrangement comprising: first logic means for accepting as input said stream, comprising token data; second logic means for partially decoding a token from said token data to determine a boundary position of said token; and third logic means for priming said processing pipeline with said token and a length marker indicating said boundary position.

The arrangement of the second aspect preferably further comprises: fourth logic means for determining if any token in said processing pipeline represents literal data and if any token in said processing pipeline represents a copy pointer; fifth logic means, responsive to said fourth logic means, for marking each token with a marker, said marker indicating which of literal data and copy pointer is represented; and sixth logic means for passing literal data from any of said tokens marked as representing literal data directly to an output means.

The arrangement of the second aspect preferably further comprises: seventh logic means for determining if any of said tokens marked as representing a copy pointer has a copy pointer pointing into said tokens in said processing pipeline at a pointed-to token; and eighth logic means, responsive to a determination that a copy pointer is pointing into said tokens in said processing pipeline at a pointed-to token, for replacing said copy pointer with the pointed-to token.

The arrangement of the second aspect preferably further comprises: ninth logic means for replacing said pointed-to token with its pointed-to data; and tenth logic means for passing said pointed-to data to an output means.

The arrangement of the second aspect is preferably an arrangement wherein any of said logic means comprises one or more processor components.

The arrangement of the second aspect is preferably an arrangement wherein said one or more processor components comprise one or more application specific integrated circuits.

BRIEF DESCRIPTION OF THE DRAWINGS

A preferred embodiment of the present invention will now be described by way of example only, with reference to the accompanying drawings, in which.

DETAILED DESCRIPTION OF THE PREFERRED EMBODIMENT

Figure 1:
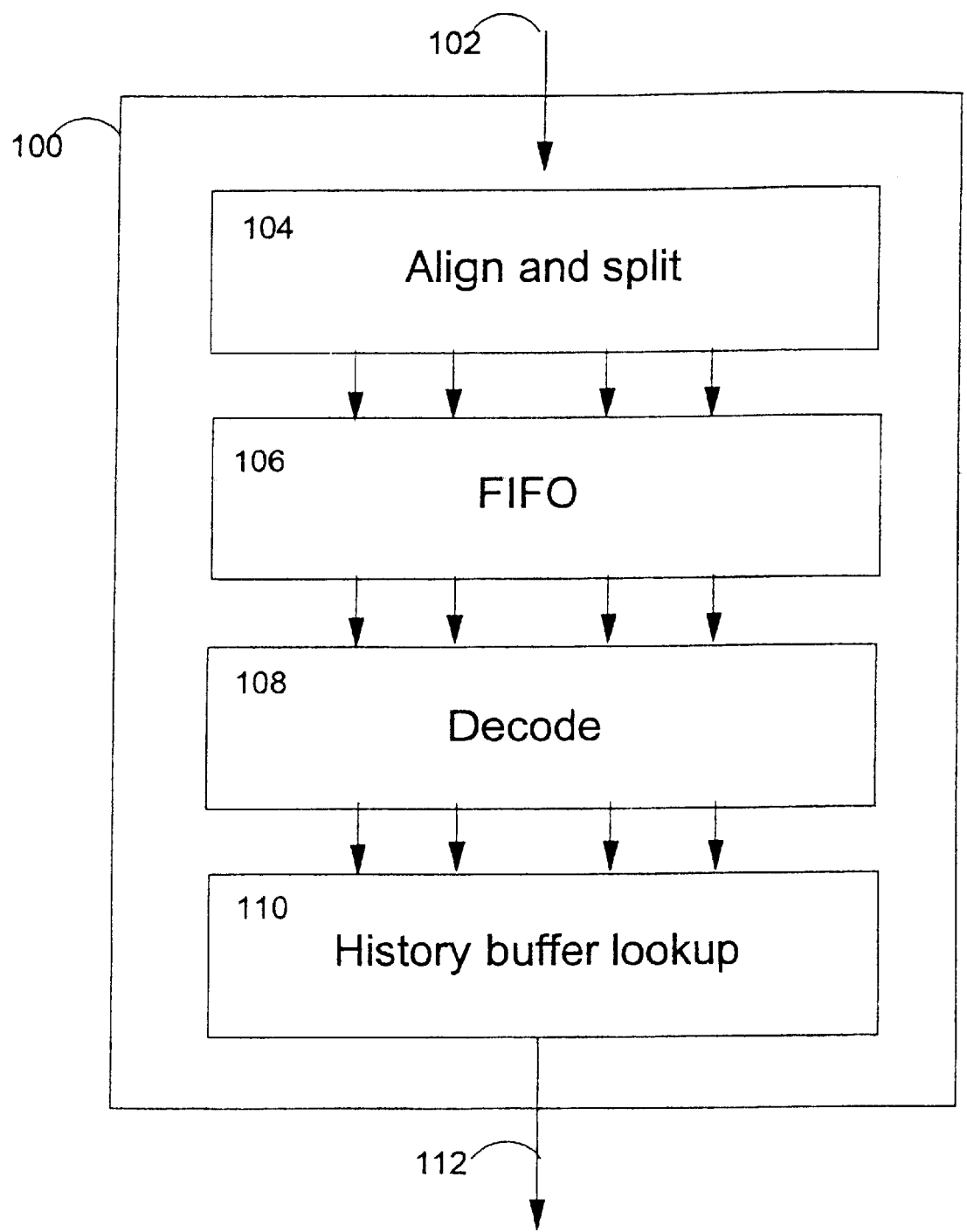
FIG. 1 is a block diagram representing the four stage pipeline of a preferred embodiment of the present invention.

In a preferred embodiment of the present invention using a pipeline (100) with a token FIFO (106) in the middle, improved performance in decompression is achieved. In the preferred embodiment the operation to be done at each stage in the pipeline (100) has been selected to maximize the width of the design. Preferred embodiments of the invention are scalable to any selected design width and thus the scope of the invention is not limited to any particular design width.

In the presently preferred embodiment, the pipeline has been split into four stages for convenience of description. However, it will be immediately apparent to one skilled in the art that each of the stages may be further subdivided into parts according to the sub-operations necessary to achieve the overall desired result from the complete pipeline stage.

One preferred embodiment of the present invention produces twelve bytes each cycle, but the embodiments can be easily extended, and are limited only by the constraints of the available underlying technology and cycle time.

A preferred embodiment of the present invention consists of a pipeline (100) containing the following sections:

1. Align & Split (104)
2. FIFO (106)
3. Decode (108)
4. History Buffer Lookup (110)

Some tokens decode to produce many output bytes, while others produce just one. In order to overcome the problems associated with not knowing in advance how many tokens will be used in a cycle, FIFO (106) is used. In one embodiment using a 12 byte design, the task of FIFO (106) is to ensure that 12 tokens are available for processing during each cycle, even though they may not all be used. The subsequent logic decodes a subset of these tokens to produce exactly 12 output bytes each cycle. It also feeds back to the FIFO logic to indicate how many tokens have been used so that these can be discarded from FIFO (106) before the next cycle.

On the input side of the FIFO (106) the logic is arranged so that it is capable of adding a minimum of 12 tokens (102) to FIFO (106) in one cycle. As the maximum number of tokens (102) which can be removed from the FIFO (106) in one cycle is 12 (if they all happen to be literals), this guarantees that the FIFO (106) will not underrun. If, on the other hand, a large token (102) is being processed at the output of the FIFO (106), the input logic may have to pause for several cycles before it has the opportunity to add more tokens to the input of the FIFO (106).

Having such a FIFO allows the decoding process to be split into two separate sections which can be solved independently. The first section of the preferred embodiment of the present invention aligns and splits the input data stream into discrete tokens and the second decodes these tokens.

The job of this first section, Align and Split (104), is to separate out individual tokens (102) from the input data stream in order that they can be placed into FIFO (106). In the present preferred embodiment, this section is split into 3 separate pipelined stages because, if the tokens (102) were fully separated to individual tokens in one cycle, the time taken would be much longer and so the maximum number of tokens which could be produced in a cycle would be fewer. One skilled in the art will observe that the number of pipelined stages is a design choice among a number of feasible alternative embodiments, and that many variations will be readily apparent to one skilled in the art.

The maximum number of input bits which is needed to produce 12 output bytes occurs when all the input tokens are literal (and thus each is represented by 9 bits), and is 108 bits (12*9) and so the input data width must be at least this. In the presently preferred embodiment, it is convenient to have an input data width of 128 bits which can produce at most 14 tokens with 2 bits left over. However, one skilled in the art will observe that this is a design choice among a number of alternatives, and equally preferred embodiments may accommodate more or fewer bits, depending upon the underlying hardware and system organization.

The first stage of the process which aligns tokens (102) is of importance as it is this stage which limits the maximum width of the design. This stage has to inspect the input data and determine where the token boundaries are. It must remember where the last token boundary is and save the remaining bits which form the first part of the next token until the next cycle when these bits are prepended to the next 128 bits of input data stream. The output of this stage is a maximum of 149 bits (128+21) as the longest token is 22 bits and so the longest partial token to carry to the next cycle is 21 bits. Because of the prepend of the previous partial token, it is known that the output of this stage starts on a token boundary.

Figure 2A:
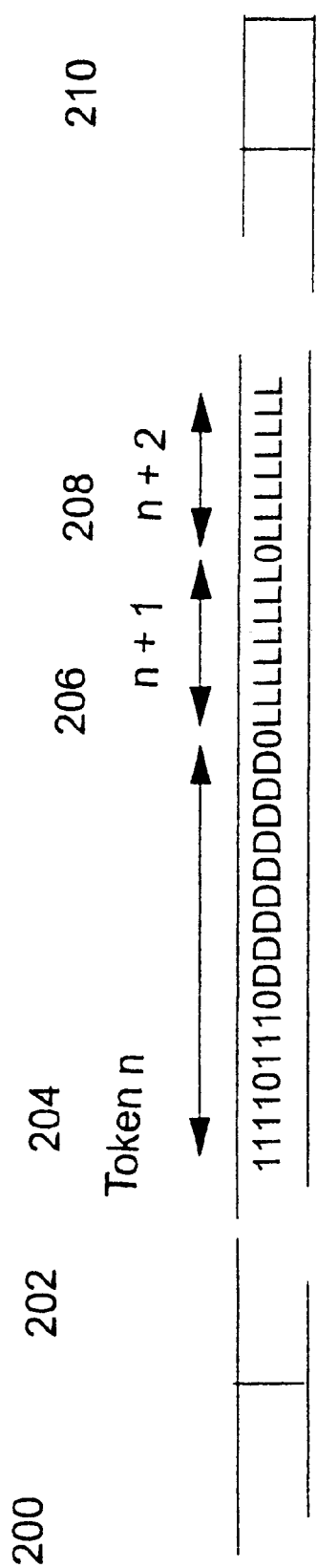
FIG. 2a represents a portion of a compressed data stream in the token FIFO of a preferred embodiment of the present invention.
Figure 2B:
FIG. 2b represents a "lastbits" array of a preferred embodiment of the present invention.

The two parts of FIG. 2 show the incoming data (FIG. 2a) and the lastbits array (214 of FIG. 2b), which is used in the process of determining and marking the token boundaries. Starting with the first token, shown in FIG. 2a as Token n, combinatorial logic is used to determine the length of the token by decoding the first few bits of the token. The bit in the lastbits array (214) which corresponds to the last bit of the input token is set to one. The fact that this bit is set will then enable separation out of the next token in a similar fashion. This process ripples down through the tokens as the separation out of each subsequent token depends on the separation out of the previous one. It is only by doing the minimum of work here that it is possible to complete the process in time to know where the data should be split to provide the input for the next cycle.

So for example, if Token n in FIG. 2a starts at bit position p in the input, lastbits (p−1) will have been set by the previous decode. This will enable the decoding of the first few bits of token n in order to work out its length. This will in turn be used to set the correct bit in the lastbits array, in this case p+17, as Token n is 18 bits in length. This will then permit the decode of the next token, in this case a literal of 9 bits, and so on. The size of the partial token remaining for the next cycle can be found by scanning back from the end of the lastbits array (214) and counting the number of zeros found before a one is encountered.

A count of the number of tokens found is also output for use in the subsequent stages. In the implementation of the present preferred embodiment, it takes a further two stages of pipeline (100) to completely separate out the individual tokens, although, as one skilled in the art would readily understand, more stages of pipeline (100) could be used if required.

The completion of the decode of the token takes 2 further stages of pipeline (100).

Figure 3:
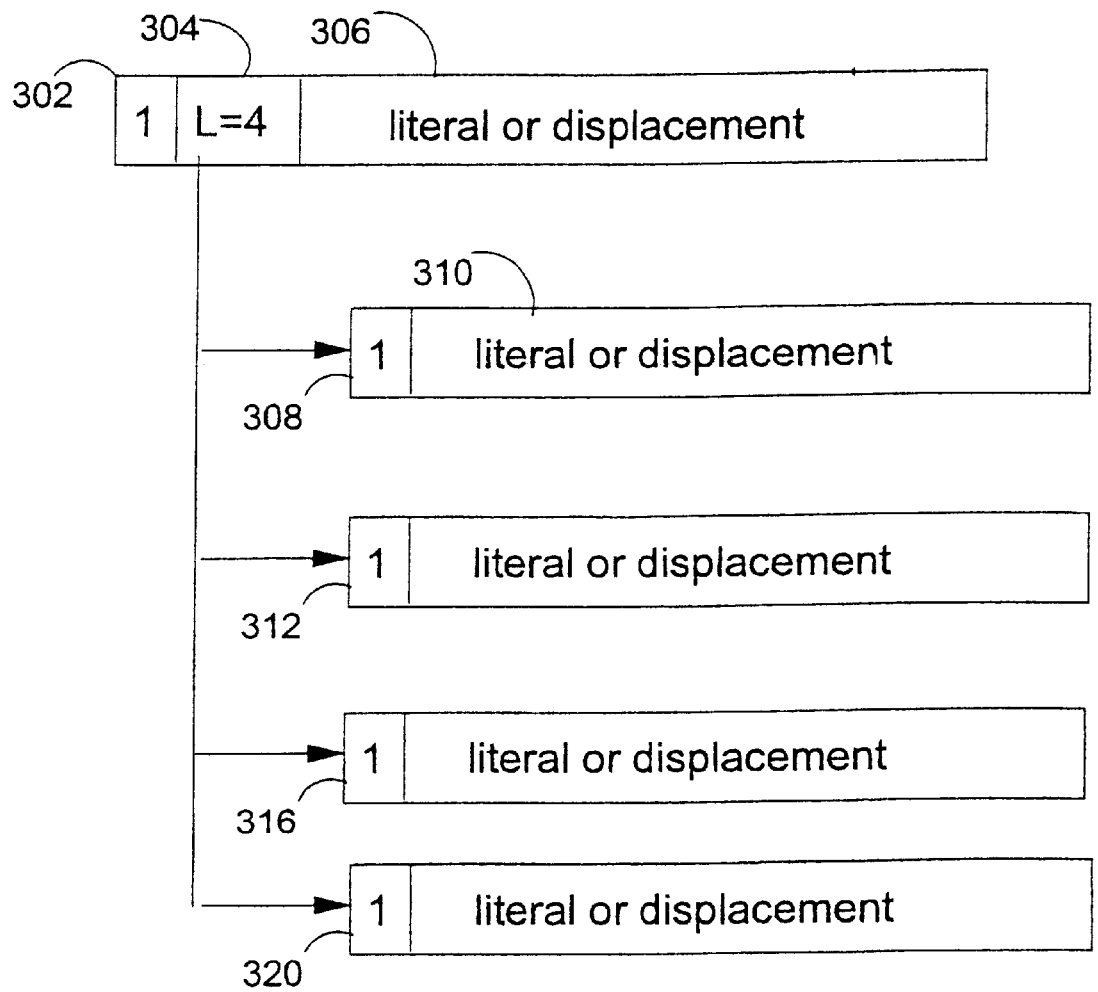
FIG. 3 shows the derivation of the partially decoded tokens to be supplied to the second part of the decode stage of the pipeline of a preferred embodiment of the present invention.

The first of these stages partially decodes the tokens so that there is one output token for each of the 12 bytes of output data which will be produced. These partially decoded tokens have one bit to indicate whether the token is a literal or a copy pointer, and a second field which is either a literal or a displacement into the history buffer. FIG. 3 shows the relationship between the input tokens (302) and the partially decoded tokens (308, 312, 316, 320).

The second of these stages deals with the case where the displacement in one of the copy pointer tokens points to an earlier token within the 12 being decoded. If this is found to be the case, the token is substituted with the value of the earlier token to which it points. This may either be a literal, or a pointer to the history buffer. If it was a pointer to somewhere else in the 12 bytes, it will already have been substituted. This means that at the output of this decode stage (108) all partially decoded tokens are either literals or references to the history buffer from previous cycles; that is, there are no references to other bytes within the 12 being decoded.

At the input to the history buffer lookup stage (110) are 12 partially decoded tokens. Any literal can be passed straight through to the output (without the bit that indicated that the token was a literal), while copy pointer tokens are looked up in the history buffer by means of a multiplexor (one for each of the 12 possible tokens) which selects the correct byte from the history buffer.

The LZ1 decompressed data is thus output from the pipeline of the presently preferred embodiment of the invention.

It will be clear to one skilled in the art that the preferred embodiment described herein represents a single example of the possible economical and efficient embodiments that are available. Where, for example, a design width of 12 bytes has been specified, it will be clear that the design width is a function of the available processing capabilities of the underlying hardware and system structures, and that scaling up of the design to handle greater design widths is feasible both with present and future technologies.

It will be clear to one skilled in the art that additional exploitation of parallel processing and other optimizations fall within the scope of readily contemplated variations on the present invention.

What is claimed is:

1. A method for decompressing three or more bytes per processor cycle from a stream of compressed data using a processing pipeline, wherein said compressed data is represented by tokens of varying and unknown length, the method comprising:

accepting as input said stream, comprising token data;

partially decoding a token from said token data to determine a boundary position of said token; and priming said processing pipeline with said token and a length marker indicating said boundary position.

2. A method as in claim 1, further comprising:

determining if any token in said processing pipeline represents literal data and if any token in said processing pipeline represents a copy pointer;

responsive to said determining, marking each token with a marker, said marker indicating which of literal data and copy pointer is represented; and passing literal data from any of said tokens marked as representing literal data directly to an output device.

3. A method as in claim 2, further comprising:

determining if any of said tokens marked as representing a copy pointer has a copy pointer pointing into said tokens in said processing pipeline at a pointed-to token; and responsive to a determination that a copy pointer is pointing into said tokens in said processing pipeline at a pointed-to token, replacing said copy pointer with the pointed-to token.

4. A method as in claim 3, further comprising:

replacing said pointed-to token with data corresponding to the pointed-to token; and passing said corresponding data to an output.

5. An apparatus for decompressing three or more bytes per processor cycle from a stream of compressed data using a processing pipeline, wherein said compressed data is represented by tokens of varying and unknown length, the apparatus comprising:

first logic for accepting as input said stream, wherein said stream comprises token data;

second logic for partially decoding a token from said token data to determine a boundary position of said token; and third logic for priming said processing pipeline with said token and a length marker indicating said boundary position.

6. An apparatus as in claim 5, further comprising:
fourth logic for determining if any token in said processing pipeline represents literal data and if any token in said processing pipeline represents a copy pointer;
fifth logic, responsive to said fourth logic, for marking each token with a marker, said marker indicating which of literal data and copy pointer is represented; and
sixth logic for passing literal data from any of said tokens marked as representing literal data directly to an output device.

7. An apparatus as in claim 6, further comprising:
seventh logic for determining if any of said tokens marked as representing a copy pointer has a copy pointer pointing into said tokens in said processing pipeline at a pointed-to token; and
eighth logic, responsive to a determination that a copy pointer is pointing into said tokens in said processing pipeline at a pointed-to token, for replacing said copy pointer with the pointed-to token.

8. An apparatus as in claim 7, further comprising:
ninth logic for replacing said pointed-to token with data corresponding to the pointed-to token; and
tenth logic for passing said corresponding data to an output device.

9. An apparatus as in claim 6, wherein any one or more of said fourth through said sixth logic processors comprise at least one processor component.

10. An apparatus as in claim 9, wherein said at least one of said processor components comprise at least one application specific integrated circuit.

11. An apparatus as in claim 5, wherein any one or more of said first through said third logic comprise at least one processor component.

12. An apparatus as in claim 11, wherein said at least one of said processor components comprise at least one application specific integrated circuit.

13. A computer readable storage medium comprising a computer program product for decompressing three or more bytes per processor cycle from a stream of compressed data, wherein said compressed data is represented by tokens of varying and unknown length, comprising computer readable program code for causing a computer to:
input said stream, comprising token data;
partially decode a token from said token data to determine a boundary position of said token; and
initiate a processing pipeline with said token and a length marker for indicating said determined boundary position.

14. A computer readable storage medium as in claim 13, where said computer readable program code further causes the computer to:
determine if any token in said processing pipeline represents literal data, and if any token in said processing pipeline represents a copy pointer;
responsive to the determination, marking each such token with a marker, said marker indicating which of literal data and copy pointer is represented; and
passing literal data from any of said tokens marked as representing literal data directly to an output.

15. A computer readable storage medium as in claim 14, where said computer readable program code further causes the computer to:
determine if any of said tokens marked as representing a copy pointer has a copy pointer pointing into said tokens in said processing pipeline at a pointed-to token; and
responsive to a determination that a copy pointer is pointing into said tokens in said processing pipeline at a pointed-to token, replacing said copy pointer with the pointed-to token.

16. A computer readable storage medium as in claim 15, where said computer readable program code further causes the computer to:
replace said pointed-to token with data corresponding to the pointed-to token; and
pass said corresponding data to said output.

17. An apparatus for decompressing three or more bytes per processor cycle from a stream of compressed data using a processing pipeline, wherein said compressed data is represented by tokens of varying and unknown length, the apparatus comprising:
a first logic means for accepting as input said stream, wherein said stream comprises token data;
a second logic means for partially decoding a token from said token data to determine a boundary position of said token; and
a third logic means for priming said processing pipeline with said token and a length marker indicating said boundary position.

18. An apparatus as in claim 17, further comprising:
a fourth logic means for determining if any token in said processing pipeline represents literal data and if any token in said processing pipeline represents a copy pointer;
a fifth logic means, responsive to said fourth logic means, for marking each token with a marker, said marker indicating which of literal data and copy pointer is represented; and
a sixth logic means for passing literal data from any of said tokens marked as representing literal data directly to an output.

19. An apparatus as in claim 18, further comprising:
a seventh logic means for determining if any of said tokens marked as representing a copy pointer has a copy pointer pointing into said tokens in said processing pipeline at a pointed-to token; and
an eighth logic means, responsive to a determination that a copy pointer is pointing into said tokens in said processing pipeline at a pointed-to token, for replacing said copy pointer with the pointed-to token.

20. An apparatus as in claim 19, further comprising:
a ninth logic means for replacing said pointed-to token with data corresponding to the pointed-to token; and
a tenth logic means for passing said corresponding data to an output means.

21. Apparatus for decompressing data that was compressed in accordance with a Lempel-Ziv algorithm, comprising:
an input for receiving input data representing tokens to be processed;
an align and split unit coupled to said input for inspecting the input data for determining locations of token boundaries;
a first in-first out (FIFO) buffer having an input coupled to an output of said align and split unit for ensuring the availability of up to n tokens for decoding during each processing cycle;

a decoder having an input coupled to an output of said FIFO, said decoder outputting partially decoded tokens; and a history buffer lookup stage having an input coupled to said output of said decoder, said history buffer lookup stage being responsive to said partially decoded tokens for, passing any token determined to be a literal to an output of the apparatus, and looking up in the history buffer any token determined to be a copy pointer token to select a correct byte from said history buffer to be output from the apparatus, where said apparatus outputs n bytes per processing cycle.

22. Apparatus as in claim 21, where said history buffer lookup stage comprises an n-way multiplexor for selecting the correct byte from the history buffer.

23. Apparatus as in claim 22, where n equals 12.

24. Apparatus as in claim 21, where n equals 12.

* * * * *